United States Patent [19]
Premerlani et al.

[11] Patent Number: 5,786,708
[45] Date of Patent: Jul. 28, 1998

[54] SELF-TUNING AND COMPENSATING TURN FAULT DETECTOR

[75] Inventors: William James Premerlani, Scotia; Gerald Burt Kliman, Niskayuna, both of N.Y.; David Jeremiah Hoeweler, Cincinnati, Ohio; Rudolph Alfred Albert Koegl, Niskayuna, N.Y.

[73] Assignee: General Electric Company, Schenectady, N.Y.

[21] Appl. No.: 617,718

[22] Filed: Apr. 1, 1996

[51] Int. Cl.⁶ .................................................. G01R 31/34
[52] U.S. Cl. .......................... 324/772; 324/545; 364/576
[58] Field of Search .......................... 324/772, 545, 324/76.21, 76.24; 318/802, 806; 340/648; 364/482, 576, 715.01

[56] References Cited

U.S. PATENT DOCUMENTS

| | | | |
|---|---|---|---|
| 4,258,302 | 3/1981 | Plunkett | 318/802 |
| 4,547,726 | 10/1985 | Premerlani | 324/76.21 |
| 4,585,985 | 4/1986 | Bose | 318/803 |
| 4,715,000 | 12/1987 | Premerlani | 364/576 |
| 5,252,915 | 10/1993 | Sedding et al. | 324/772 |
| 5,270,640 | 12/1993 | Kohler et al. | 324/772 |
| 5,345,158 | 9/1994 | Kliman et al. | 324/432 |
| 5,477,163 | 12/1995 | Kliman | 324/772 |
| 5,514,978 | 5/1996 | Koegl et al. | 324/772 |
| 5,629,870 | 5/1997 | Farag et al. | 324/76.21 |

OTHER PUBLICATIONS

"Alternatives for Assessing the Electrical Integrity of Induction Motors" by Kohler, et al, IEEE Transactions on Industry Applications, vol. 28, No. 5, Sep./Oct. 1992, pp. 1109–1117.

"Torque Equation in Arbitrary Reference–Frame Variables" by PC Krause, Analysis of Electric Machinery, 1986, p. 178. (month unavailable).

"An On–Line Method to Detect Incipient Failure of Turn Insulations in Random–Wound Motors" by Sottile, et al, Presented at the IEEE/PES Winter (month unavailable).

*Primary Examiner*—Ernest F. Karlsen
*Attorney, Agent, or Firm*—Ann M. Agosti; Marvin Snyder

[57] ABSTRACT

A method for detecting turn faults in an induction motor includes obtaining motor current and voltage waveforms and converting the motor current and voltage waveforms to digitized current and voltage waveforms. Fundamental phasors of the digitized current and voltage waveforms are extracted and, a symmetrical component transform is applied to the fundamental phasors to obtain symmetrical component current and voltage phasors including a negative sequence voltage phasor ($V_-$) and negative sequence current phasor ($I_-$). A fault injected negative sequence current ($I_{i-}$) is estimated according to the following equation:

$$I_{i-}=I_- - V_-/Z_- - I_r$$

wherein $Z_-$ is a characteristic negative sequence impedance and $I_r$ is a residual injected negative sequence current. The existence of a turn fault is determined by comparing the estimated fault injected negative sequence current with a threshold fault injected negative sequence current.

17 Claims, 4 Drawing Sheets

SELF-TUNING AND COMPENSATING TURN FAULT DETECTOR

BACKGROUND OF THE INVENTION

In one method of detecting a turn fault in an AC motor, as described in Kohler et al., U.S. Pat. No. 5,270,640, line current and voltage phasors are determined in an initial step by performing a fast fourier transform (FFT) on current and voltage waveforms to extract the fundamentals. The FFT generally requires several 360 degree cycles. In an additional step, the standard symmetrical component transformation of these phasors is performed to derive the positive and negative sequence voltages (V+ and V−) and currents (I+ and I−) from which the apparent impedance phasors (Z+=V+/I+ and Z−=V−/I−) can be calculated. Because considerable averaging must be done in finding the phasors and calculating the impedances, the measurement is time consuming and can require at least several cycles. Additionally, the negative sequence voltage (V−) is often too small to provide a meaningful result for the apparent negative sequence impedance (Z−) calculation.

Conventional implementations of negative sequence impedance methods of on-line turn fault detection have lacked resolution with poor signal-to-noise ratio resulting from considerable noise and harmonics. Furthermore, induced faults often register as increased impedance, which is a phenomena that appears to contradict the notion that the impedance should decrease when shorts occur in a phase. Moreover, when the incoming line has relatively low negative sequence voltages, the impedance becomes indefinite and its value can vary widely.

Most mathematical analyses of turn faulted motors assume a motor that is, except for the fault, symmetric and that is excited by symmetric three phase lines. The complexity and computation required in these models causes them to be inconvenient for evaluating turn faults in unsymmetric motors excited by unsymmetric lines.

In commonly assigned Kliman, U.S. Pat. No. 5,477,163, issued Dec. 19, 1995, a more sensitive and reliable apparent negative sequence impedance turn fault detection method is obtained by estimating the per unit (pu) slip via a torque calculation and using the estimation to remove load variation from the negative sequence impedance by providing an adjusted apparent negative sequence impedance value.

In a commonly assigned application, Koegl et al., U.S. application Ser. No. 08/407,550, filed Mar. 20, 1995, now U.S. Pat. No. 5,514,978, a turn fault detection method is described which is capable of operating under conditions of both balanced and unbalanced supply voltages, as well as variations in supply voltage, while factoring in realistic measurement accuracies and other sources of error. Koegl et al. indicate that the negative sequence current resulting from a turn fault does not arise only from a change in the negative sequence impedance, which is essentially constant for small faults except for load effects, and that a fault current resulting from a turn fault is, in effect, injected into the negative sequence circuit from the positive sequence circuit via coupling through the fault. The fault-injected current, which is separated from the measured current in the negative sequence impedance, can be used as a fault indicator.

Residual effects on the negative sequence current result from inherent and designed asymmetries in the motor and motor sensors. Although the fault injected current caused by a particular turn fault is related to the positive sequence voltage and current, the residual effects tend to vary as a different function. Therefore, depending on the magnitude of the fault and the operating point of the motor, the magnitude of the net negative sequence current can appear to decrease when a fault occurs. Under some combinations of fault and load, the net negative sequence current might not change in either amplitude or phase.

SUMMARY OF THE INVENTION

It would be advantageous to have a method of compensating a negative sequence current measurement even when residual effects from designed or inherent asymmetries and/or line voltage variations exist. In the present invention, residual injected negative sequence current in an AC motor is estimated with a function generated by monitoring the motor during a motor starting period and is then refined by monitoring the motor during operation under normal load patterns.

In one embodiment of the present invention, a method for detecting turn faults in an induction motor comprises obtaining motor current and voltage waveforms; converting the motor current and voltage waveforms to digitized current and voltage waveforms; extracting fundamental phasors of the digitized current and voltage waveforms; applying a symmetrical component transform to the fundamental phasors to obtain symmetrical component current and voltage phasors including a negative sequence voltage phasor (V_) and negative sequence current phasor (I_); estimating a fault injected negative sequence current (Ii_) according to the following equation:

$$Ii_- = I_- - V_-/Z_- - Ir$$

wherein $Z_-$ comprises a characteristic negative sequence impedance and $Ir$ comprises a residual injected negative sequence current; and determining the existence of a turn fault by comparing the estimated fault injected negative sequence current with a threshold fault injected negative sequence current. If desired, the steps of extracting fundamental phasors of the digitized current and voltage waveforms and applying a symmetrical component transform to the fundamental phasors to obtain symmetrical component current and voltage phasors can be performed by applying a weighted discrete fourier transform to the digitized current and voltage waveforms.

In one embodiment, the step of estimating the residual injected negative sequence current comprises, prior to obtaining the motor current waveforms, determining a function for the residual injected negative sequence current. If the step of applying a symmetrical component transform to the fundamental phasors to obtain symmetrical component current and voltage phasors includes obtaining a positive sequence voltage phasor and a positive sequence current phasor, the step of determining the function for the residual injected negative sequence current can include determining a function dependent upon the positive sequence voltage phasor and the positive sequence current phasor. The step of determining the function for the residual injected negative sequence current can further include obtaining initial motor current and voltage waveforms; converting the initial motor current and voltage waveforms to initial digitized current and voltage waveforms; extracting initial fundamental phasors of the initial digitized current and voltage waveforms; applying a symmetrical component transform to the initial fundamental phasors to obtain initial symmetrical component current and voltage phasors including initial positive sequence voltage phasors, initial positive sequence current phasors, and initial negative sequence current phasors; and estimating a current ratio of each one of the initial negative sequence current phasors to a respective one of the initial positive sequence current phasors.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF PREFERRED EMBODIMENTS OF THE INVENTION

Figure 1:
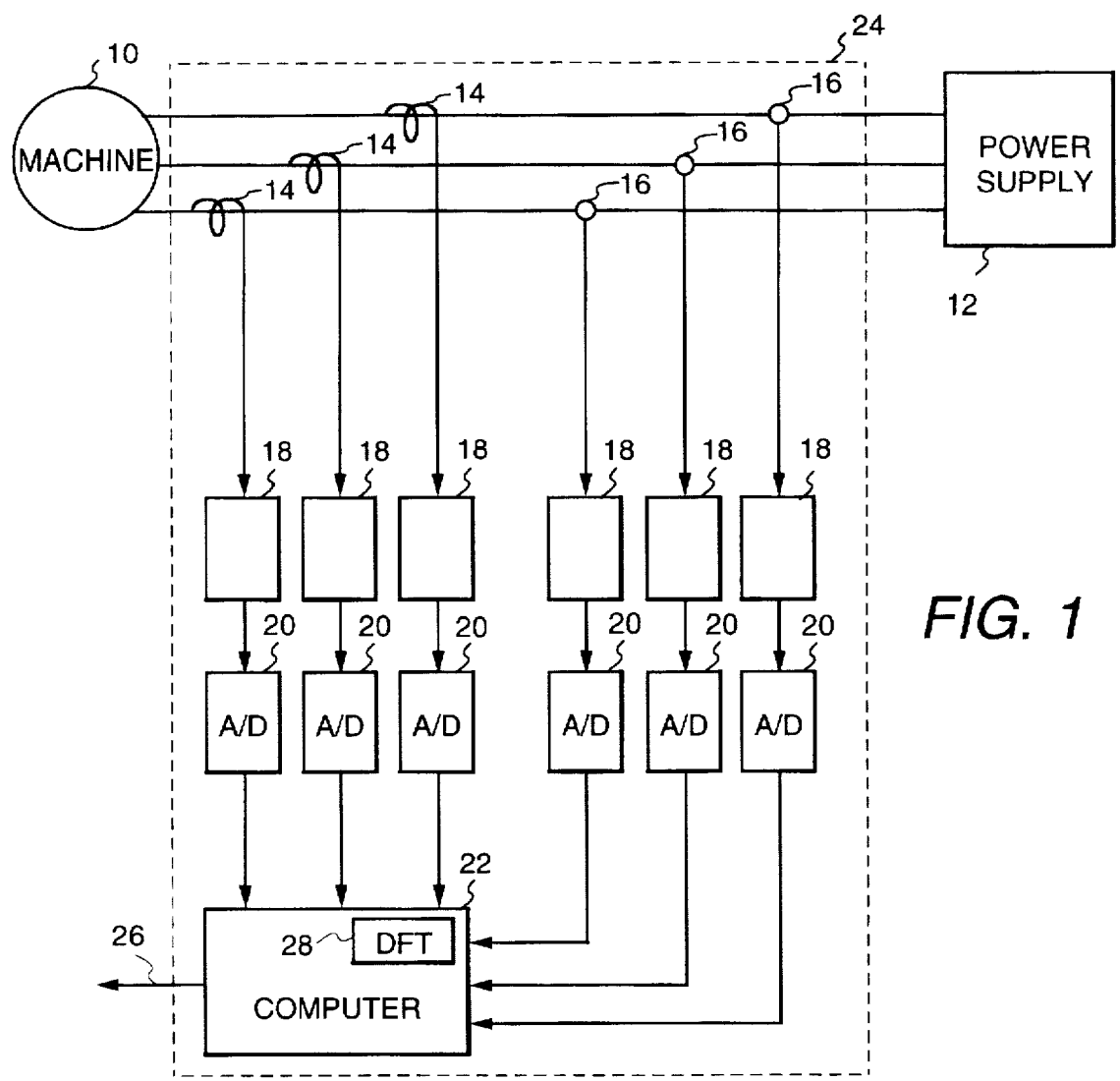
FIG. 1 is a block diagram of a data acquisition system.

FIG. 1 is a block diagram of a data acquisition system 24 for an induction machine 10 receiving power from a power supply 12, as disclosed in aforementioned Kliman, U.S. Pat. No. 5,477,163 and aforementioned Koegl et al., U.S. application Ser. No. 08/407,550, now U.S. Pat. No. 5,514,978.

Three current sensors 14 measure motor current, and three voltage sensors 16 measure motor voltage waveforms. Although three phase current and three phase voltage sensors are preferred as shown, only two current sensors and voltage sensors are actually required because the third phase current and phase voltage can then each be calculated using Kirchoff's laws. Furthermore, although a three-phase motor is shown, the invention is also applicable to two-phase motors and to motors having more than three phases.

Each measurement of a current or voltage can be processed by a respective signal conditioner 18 which may include an amplifier and an anti-aliasing filter which acts as a low-pass filter to remove components greater than one half of the sampling frequency, so that such components do not fold over and interfere with the low-pass measurement.

After the signal conditioning, each conditioned signal can be converted to a digital signal by an analog-to-digital (A/D) converter 20. There can be an individual A/D converter for each individual signal conditioner, as shown, or there can be a single A/D converter with a switch used to convert each of the six signals.

The voltages and currents that are measured can be processed in the computer by being separated into balanced but oppositely rotating sets according to the theory of symmetrical components. These measurements can be used as disclosed in aforementioned Kliman, U.S. Pat. No. 5,477,163 to determine negative sequence impedance. A discrete fourier transform (DFT) 28 in the computer can be used as described in aforementioned Koegl et al., U.S. application Ser. No. 08/407,550, now U.S. Pat. No. 5,514,978.

Figure 3:
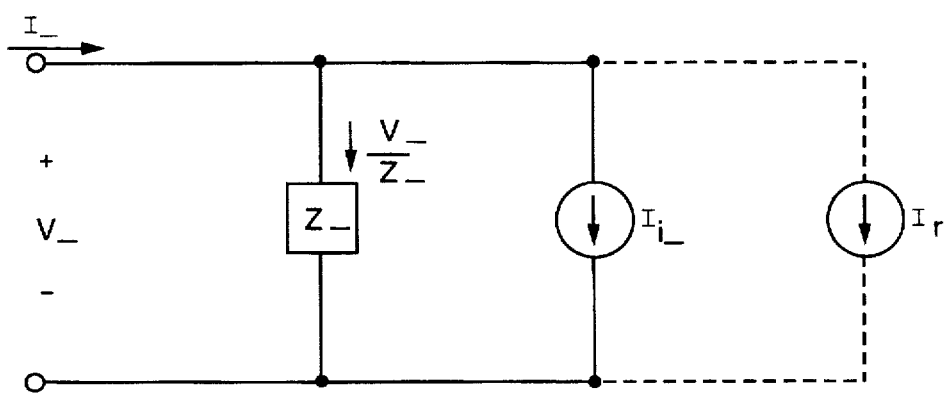
FIG. 3 is a circuit diagram illustrating the relationship between the measured negative sequence current, the fault injected negative sequence current, and the residual injected negative sequence current.
Figure 2:
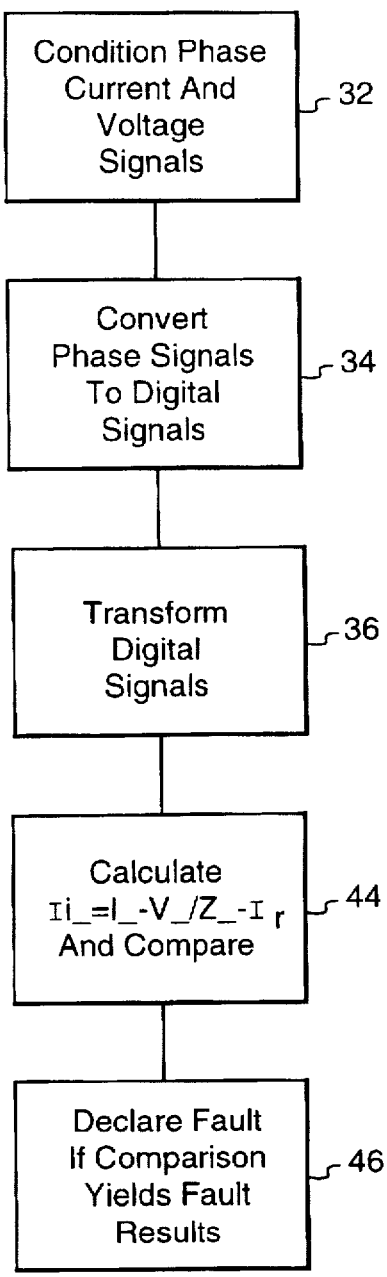
FIG. 2 is a flow chart illustrating an embodiment of the present invention.

FIG. 2 is a flow chart illustrating an embodiment of the present invention, and FIG. 3 is a circuit diagram illustrating the relationship between the measured negative sequence current, the fault injected negative sequence current, and the residual injected negative sequence current.

As stated above, aforementioned Koegl et al., U.S. application Ser. No. 08/407,550, now U.S. Pat. No. 5,514,978, indicated that the negative sequence current resulting from a turn fault does not arise only from a change in the negative sequence impedance and that a fault current resulting from a turn fault is injected into the negative sequence circuit from the positive sequence circuit via coupling through the fault. The fault-injected current, which is separated from the measured current by use of the characteristic negative sequence impedance, can be used as a fault indicator. Koegl et al. calculated the injected current $$I_i = I_- - V_-/Z_-$$

wherein $I_i$ is the injected current, $I_-$ is the measured negative sequence current, $V_-$ is the negative sequence voltage, and $Z_-$ is the approximate characteristic negative sequence impedance of the motor, and compared it to a threshold in one turn fault detection embodiment.

Although this was an improvement over conventional techniques, as discussed above, natural second order residual relations between positive and negative sequence currents result from inherent and designed asymmetries in the motor and motor sensors and from instrument and sensor calibration errors. Calibration errors in current measurements cause a portion of the positive sequence current to appear in the negative sequence current measurement. Motor asymmetry also causes a load dependent effect between positive and negative sequence currents.

Although the residuals are small, they determine the ultimate limits of sensitivity of the turn fault detection. The nature of these residuals is usually quite different from that of a turn fault, leading to different functional relationships between the positive and negative sequence currents. The interrelation can result in a fault condition wherein there is no change in the negative sequence current or the negative sequence impedance may decrease. The residuals are not, however, random. In fact, the residuals are fixed by the physical system (the motor and its sensors) and do not vary with time. Instead, the residuals are a function of the motor load, supply voltage, and supply frequency.

The present invention compensates for residuals by altering the above equation by subtracting the current resulting from the residuals as follows:

$$I_i = I_- - V_-/Z_- - I_r$$

wherein $I_r$ represents current resulting from the residuals herein referred to as residual injected negative sequence current. For given values of the magnitude of positive sequence voltage, positive sequence current, and frequency, there should be exactly one value of residual injected negative sequence current. If the residual injected negative sequence current (Ir) is measured and subtracted, then improved sensitivity and reliability can be obtained. The present invention includes a self-adjusting technique for determining the residual injected negative sequence current, as described below with respect to FIGS. 4–9.

With respect to FIG. 2, step 32 of conditioning current and voltage signals and step 34 of converting signals to digital signals can be accomplished with signal conditioner 18 and A/D converter 20, as discussed with respect to FIG. 1.

At step 36, the digital signals are transformed by extracting fundamental phasors of the digitized current and voltage waveforms and applying a symmetrical component transform to the fundamental phasors to obtain symmetrical component current and voltage phasors.

A preferred method for extracting fundamental phasors is to filter out high frequency signals and DC drifts and only pass fundamental frequency signals by using a discrete fourier transform (DFT), such as one similar to that described for determining a respective phasor value for use in determining a power system frequency in commonly assigned Premerlani, U.S. Pat. No. 4,547,726, issued Oct. 15, 1985, which is herein incorporated by reference.

As discussed in aforementioned Koegl et al., U.S. application Ser. No. 08/407,550, now U.S. Pat. No. 5,514,978, the fundamental component of a DFT is a good estimate of the amplitude and phase angle of the 60 Hz component of power system voltages and currents in the face of noise and harmonics. The following equation represents computation of the fundamental component of a phasor from data samples:

$$X(m) = \frac{2}{N} \sum_{k=m-N}^{m-1} x(k\Delta t)e^{-j2k\frac{\pi}{N}},$$

where X(m) is the estimate of the phasor value of a cycle's worth of samples X, at sample m (real time, with the fundamental in the m=1 component), with N samples taken per cycle, and where k is the summation index (an integer). For three phase analysis, the process is repeated for each phase:

$$X_a(m) = \frac{2}{N} \sum_{k=m-N}^{m-1} x_a(k\Delta t)e^{-j2k\frac{\pi}{N}}$$

$$X_b(m) = \frac{2}{N} \sum_{k=m-N}^{m-1} x_b(k\Delta t)e^{-j2k\frac{\pi}{N}}$$

$$X_c(m) = \frac{2}{N} \sum_{k=m-N}^{m-1} x_c(k\Delta t)e^{-j2k\frac{\pi}{N}}.$$

The fundamental phasors can be transformed into symmetrical components as follows:

$$X_0 = \frac{1}{3} (X_a + X_b + X_c)$$

$$X_+ = \frac{1}{3} (X_a + aX_b + a^2X_c)$$

$$X_- = \frac{1}{3} (X_a + a^2X_b + aX_c),$$

wherein "a" is a phasor of unit magnitude and an angle of 120 degrees ($e^{j2\pi/3}$), $X_O$ is the zero sequence phasor, $X_+$ is the positive sequence phasor, and $X_-$ is the negative sequence phasor.

In one embodiment, a weighted discrete fourier transform is used to extract fundamental phasors of the digitized current and voltage waveforms and apply the symmetrical component transform to the fundamental phasors to obtain symmetrical component current and voltage phasors. This is accomplished by combining the symmetrical component transform into the discrete fourier transform, as described in aforementioned Koegl et al., U.S. application Ser. No. 08/407,550, now U.S. Pat. No. 5,514,978, and thereby eliminating the need to engage in the noisy and time consuming process of finding the amplitude and phase of the line voltages and currents. By combining equations of DFT and symmetrical components, it is possible to compute a negative sequence quantity using a weighted discrete fourier transform directly from data samples:

$$X_-(m) = \frac{2}{N} \sum_{k=m-N}^{m-1} x_a(k\Delta t)e^{-j2k\frac{\pi}{N}} +$$

$$\frac{2}{N} \sum_{k=m-N}^{m-1} x_b(k\Delta t)e^{-j(2k\frac{\pi}{N} + \frac{2\pi}{3})} +$$

$$\frac{2}{N} \sum_{k=m-N}^{m-1} x_c(k\Delta t)e^{-j(2k\frac{\pi}{N} + \frac{4\pi}{3})}$$

wherein $X_-(m)$ is the estimate of the negative sequence phasor value of a cycle's worth of samples $X_a$, $X_b$, and $X_c$, at sample m (real time t), with N samples taken per cycle, k is the summation index (an integer), and "a" is a phasor of unit magnitude and an angle of 120 degrees ($e^{j2\pi/3}$). This technique provides positive, negative, and zero sequence impedances directly and efficiently.

After the transform is applied at step 36, at step 44 the current measurement is obtained by using the equation $I_i=I_--V_-/Z_--Ir$, as discussed above. The characteristic negative sequence impedance $Z_-$ varies with load but is substantially invariant to turn faults. There are several techniques for determining $Z_-$. Motor manufacturers sometimes provide circuit parameters. If the motor parameters are known and if they are reasonably independent of load, then $Z_-$ can be computed from the parameters. If a circuit parameter list is not available from the manufacturer, the parameters can be measured. One measurement technique is to run the motor under locked rotor conditions and process the resulting data to produce the equivalent circuit parameters and derive the locked rotor conditions. Another technique is to perform the data collection using normal starting conditions.

At step 46 a turn fault is indicated when the magnitude of $I_i$ exceeds a threshold. If the magnitude is zero, there is no fault. Either a fixed or a variable threshold is possible, depending on whether it is desired to increase sensitivity if the motor is lightly loaded. If a fixed threshold is used, the threshold is selected based on the desired degree of sensitivity, while considering that the lower limit of sensitivity is dictated by residual measurement errors, motor unbalance, and noise.

In one embodiment, multiple thresholds are used. If the magnitude of $I_i$ exceeds the larger threshold, an alarm will trip immediately, whereas if the magnitude exceeds the smaller threshold, the alarm will not trip until the condition persists.

The method of using a combination of a DFT and symmetrical component analysis filters out most line noise at frequencies higher than that of the line and makes the calculation extremely rapid because it can be possible to perform the calculation in just over one cycle. Synchronization to the line can be accomplished, for example, by using software control of the analog-to-digital converters which is commonly available in combination with, for example, a phase locked loop as described in aforementioned U.S. Pat. No. 4,715,000.

FIGS. 4–8 are graphical illustrations useful in providing examples of a number of methods for determining a function for the current Ir resulting from the residuals.

Figure 4:
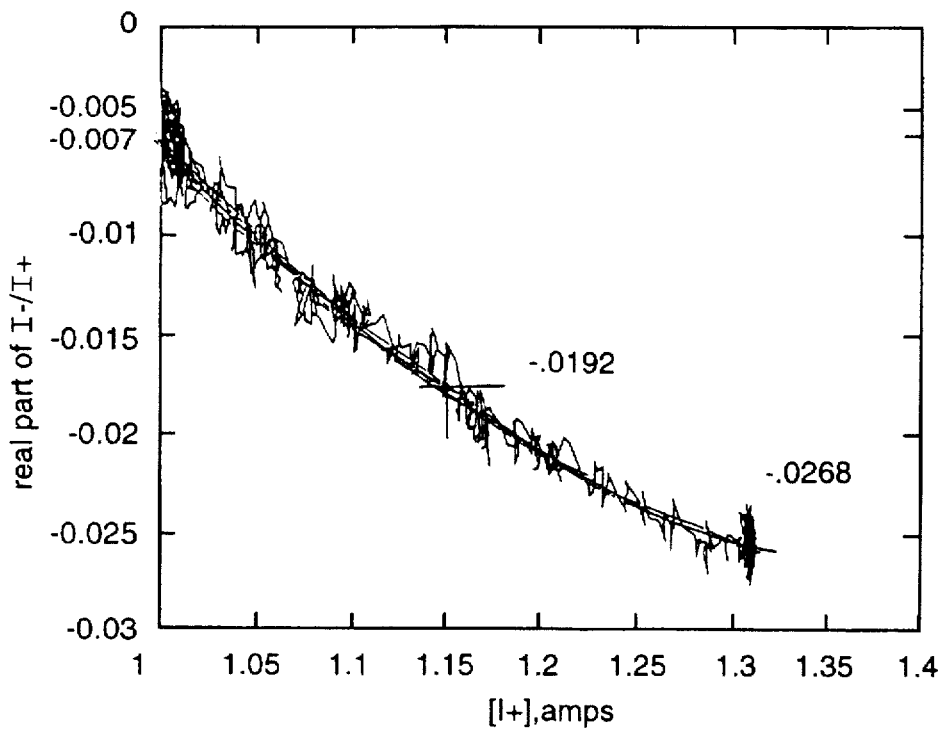
FIG. 4 is a graph of the real part of the negative/positive sequence current ratio with respect to the positive sequence current.
Figure 5:
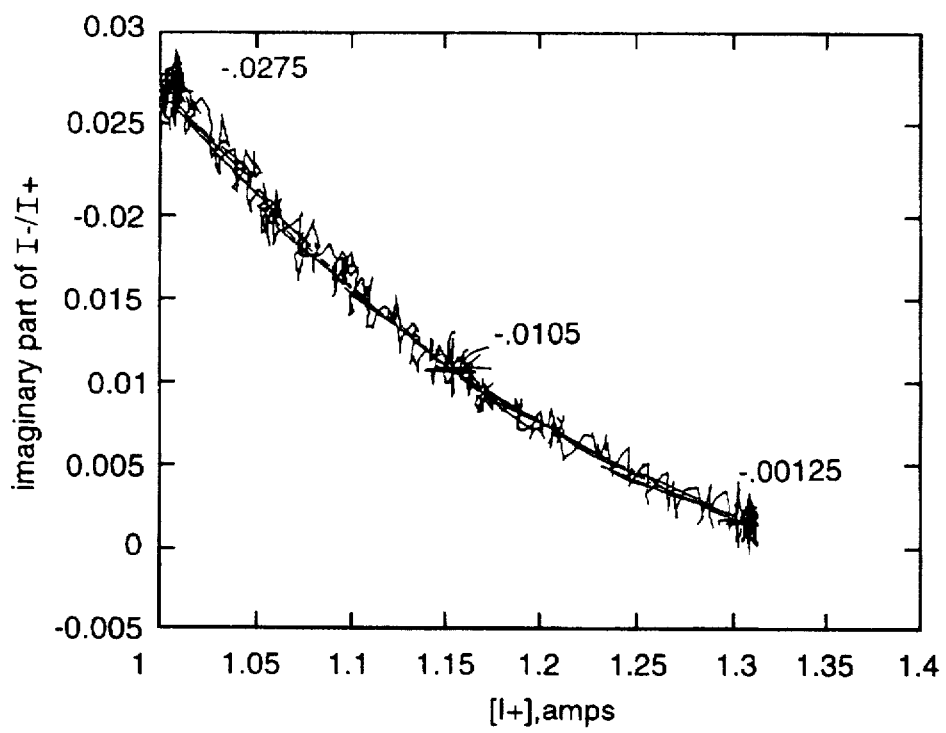
FIG. 5 is a graph of the imaginary part of the negative/positive sequence current ratio with respect to the positive sequence current.

In one embodiment, the motor is assumed to be under normal (no fault) conditions when it is first installed. Then the real and imaginary parts of Ir are measured as the motor runs, and the function and its standard deviation are determined during a short self-compensation process with the function being calculated as follows:

$$I_r = f_r(I_+, |V_+|) + j f_i(I_+, |V_+|)$$

wherein $I_+$ is the positive sequence current, $V_+$ is the positive sequence current, fr is a real function of $I_+$ and $V_+$, and fi is the imaginary function of $I_+$ and $V_+$. Because power line frequency does not change by more than 0.1 to 0.2 percent, frequency deviations are being ignored. During the function generating process, the fault injected negative sequence current $I_-$ can be measured and analyzed statistically to determine its dependence on load and voltage. The measurements occur until the $I_+$ falls below a predetermined level (typically over the first several cycles). The functions of Ir can be defined by any convenient approach. For example, as shown by FIGS. 4 and 5, the ratio of $I_-$ to $I_+$ was used because it was a convenient ratio for fitting curves and surfaces. Other functions such as $I_-$ itself, for example, can alternatively be used, if desired.

After a function for Ir is determined, the motor runs in the protection mode by determining when fault injected negative sequence current $I_{i-}$ at a given supply and current exceeds a threshold in a statistically significant way, as discussed above.

The dependency of the residual injected negative sequence current Ir need not be expressed in terms of the load and supply voltage and, for example, can instead be expressed in terms of other variables that depend monotonically on the load and supply voltage. In one embodiment, the real part of the positive sequence current is used to represent the load, and in another embodiment, the absolute value of the positive sequence current is used. The variables used to determine the residual injected negative sequence current during the training period are preferably also used later in determining whether or not a turn fault is present.

FIG. 4 is a graph of the real part of Ir (as represented by a negative/positive sequence current ratio) with respect to the positive sequence current, and FIG. 5 is a graph of the imaginary part of Ir (as represented by a negative/positive sequence current ratio with respect to the positive sequence current).

In the embodiment of FIGS. 4 and 5 a curve fit is performed while the load (current) of the motor is varied. This technique is useful because the curves can be extrapolated using textbook equations such as is done, for example, by computer software available from The Math Works, Inc. in Natick, Mass., under the name MATLAB®.

Figure 6:
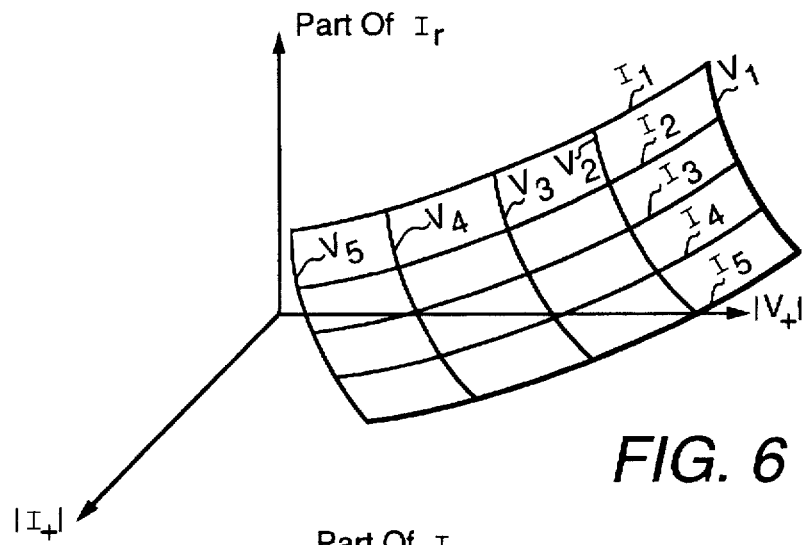
FIG. 6 is an example graph of a part of residual injected negative sequence current with respect to both the positive sequence current for selected positive sequence voltages and the positive sequence voltage for selected positive sequence currents.

For illustrative purposes, the graphs of FIGS. 4 and 5 are for a constant positive sequence voltage. FIG. 6 is an example graph of a part (representative of either a real or imaginary portion) of the residual injected negative sequence current with respect to both the positive sequence current for selected positive sequence voltages and the positive sequence voltage for selected positive sequence currents.

If a plurality of voltage levels are used with the load being varied over each voltage level, a plurality of curves such as indicated by V1, V2, V3, V4, and V5 can be fit. Likewise, a plurality of current levels can be used with the voltage being varied over each current level to form a plurality of curves such as indicated by I1, I2, I3, I4, and I5.

In the embodiment of FIG. 6, if there is a scarcity of current data, it is preferable to select constant voltage levels and obtain current data for each of the constant voltage levels. Correspondingly, if there is a scarcity of voltage data, it is preferable to select constant current levels and obtain voltage data for each of the constant current levels.

Figure 7:
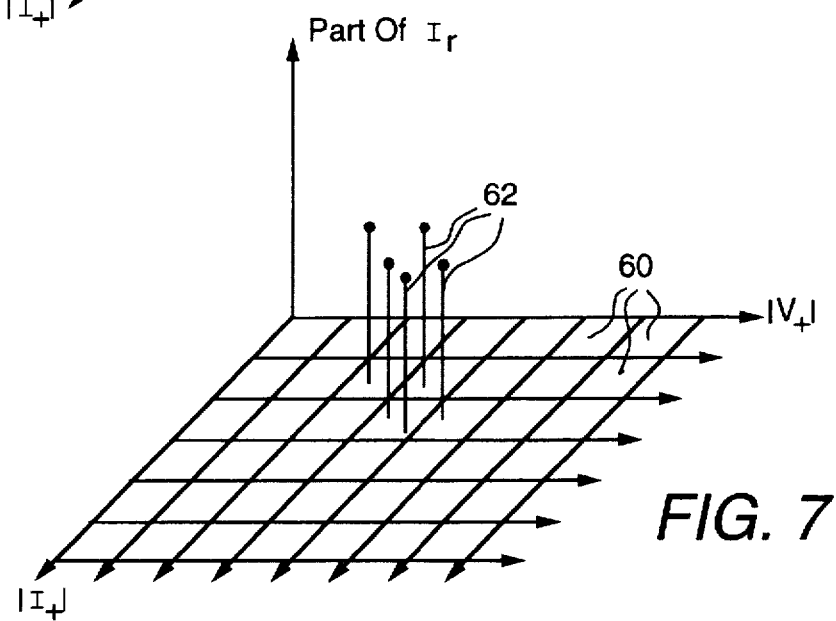
FIG. 7 is an example graph of a part of residual injected negative sequence current with respect to the positive sequence voltage and current bins.

FIG. 7 is an example graph of a part (representative of either a real or imaginary portion) of the residual injected negative sequence current with respect to the positive sequence voltage and current "bins" 60. In this embodiment, the domain of the function is broken into many small bins (regions) with a mean of the negative/positive sequence current ratio and standard deviation being calculated for each bin.

The means and variances can be obtained in one of a number of techniques. In a precise but expensive embodiment, for example, data can be obtained only where needed. In a more convenient embodiment, the data acquisition can be accomplished randomly. In this embodiment, the normal duty cycle of the motor can occur for several days, for example, with data being collected during that period.

Curve fits such as shown in FIG. 6 require less computer memory space than the bin embodiment of FIG. 7; however, the bin embodiment is more robust than the curve fit embodiment and is mathematically simpler because it makes no assumptions about surface shape.

Another factor to consider is that random data acquisition for the embodiment of FIG. 7 can result in some bins remaining without mean and variance data. If a non-data bin is between other bins, either an interpolation can be performed to assign values or the voltage and current levels of the motor can be purposely set such that values are obtained. Interpolation becomes more complicated if the missing data bins are situated on the edges of other bins (instead of between). In this situation, it can be appropriate to perform a curve analysis such as shown in FIG. 6. Determining values for bins without data by either experimentation or interpolation is important because a turn fault in a motor can often put the motor into a state in which it does not normally run and thus force the motor into a bin it has not been in before.

Each bin is defined by a specific current range and voltage range. Bins having a smaller current and voltage area provide increased accuracy over larger bins, but more bins without data can result.

Figure 8:
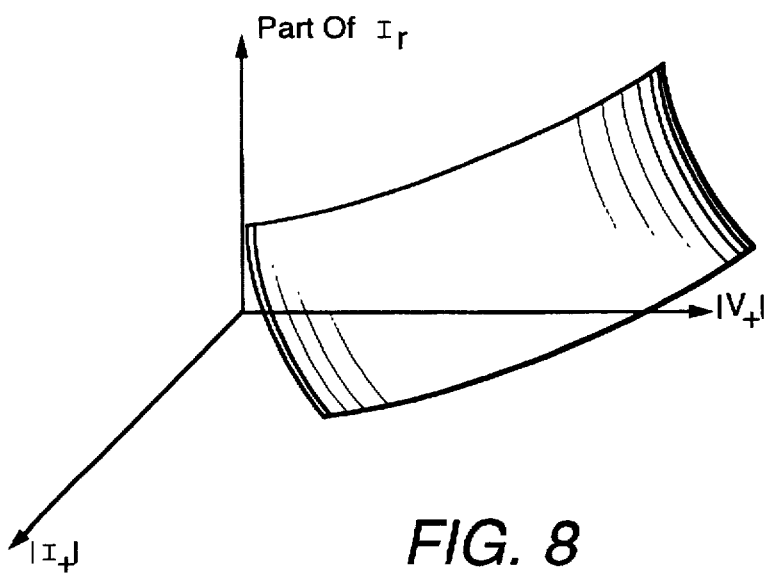
FIG. 8 is an example graph of a part of residual injected negative sequence current with respect to positive sequence voltage and current.

FIG. 8 is an example graph a surface curve of a part (representative of either a real or imaginary portion) of the residual injected negative sequence current with respect to positive sequence voltage and current. A surface curve can be obtained using textbook equations such as is done, for example, by computer software available from The Math Works, Inc. under the name MATLAB®. A real or imaginary part of the negative/positive sequence current ratio with respect to positive sequence voltage and current can be expressed, for example, by the equation:

$$f = A*|U_+| + B*|U_+|^2 + C*|V_+| + D*|V_+|^2 + E*|U_+|*|V_+| + F$$

wherein A, B, C, D, E, and F are complex numbers. The embodiment of FIG. 8 is advantageous because it provides for ease of extrapolation. However, some estimation and complicated computer modeling can be required to determine what shape a particular surface may occupy and what function best fits that surface.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method for detecting turn faults in an induction motor comprising the steps of:

obtaining motor current waveforms;

obtaining motor voltage waveforms;

converting the motor current waveforms to digitized current waveforms and the motor voltage waveforms to digitized voltage waveforms;

extracting fundamental phasors of the digitized current waveforms and the digitized voltage waveforms;

applying a symmetrical component transform to the fundamental phasors to obtain symmetrical component current and voltage phasors including a negative sequence voltage phasor ($V_-$) and negative sequence current phasor ($I_-$);

estimating a residual injected negative sequence current (Ir);

estimating a fault injected negative sequence current ($Ii_-$) according to the following equation:

$$Ii_- = I_- - V_-/Z_- - Ir,$$

wherein $Z_-$ comprises a characteristic negative sequence impedance; and determining the existence of a turn fault by comparing the estimated fault injected negative sequence current with a threshold fault injected negative sequence current.

2. The method of claim 1, wherein the steps of extracting fundamental phasors of the digitized current waveforms and the digitized voltage waveforms and applying a symmetrical component transform to the fundamental phasors to obtain symmetrical component current and voltage phasors comprise applying a weighted discrete fourier transform to the digitized current waveforms and the digitized voltage waveforms.

3. The method of claim 2, wherein the step of extracting fundamental phasors of the digitized current waveforms and the digitized voltage waveforms comprises applying a discrete fourier transform to the digitized current waveforms and the digitized voltage waveforms, and wherein the step of estimating the residual injected negative sequence current comprises, prior to obtaining the motor current waveforms, determining a function for the residual injected negative sequence current.

4. The method of claim 3, wherein the step of applying a symmetrical component transform to the fundamental phasors to obtain symmetrical component current and voltage phasors includes obtaining a positive sequence voltage phasor and a positive sequence current phasor; and wherein the step of determining the function for the residual injected negative sequence current includes determining a function dependent upon the positive sequence voltage phasor and the positive sequence current phasor.

5. The method of claim 4, wherein the step of determining the function for the residual injected negative sequence current includes:

obtaining initial motor current waveforms;

obtaining initial motor voltage waveforms;

converting the initial motor current waveforms to initial digitized current waveforms and the initial motor voltage waveforms to initial digitized voltage waveforms;

extracting initial fundamental phasors of the initial digitized current waveforms and the initial digitized voltage waveforms;

applying a symmetrical component transform to the initial fundamental phasors to obtain initial symmetrical component current and voltage phasors including initial positive sequence voltage phasors, initial positive sequence current phasors, and initial negative sequence current phasors; and estimating a current ratio of each one of the initial negative sequence current phasors to a respective one of the initial positive sequence current phasors.

6. The method of claim 5, wherein the step of determining the function further includes creating a plurality of curves of the current ratio with respect to the magnitude of the initial positive sequence current phasor, each of the plurality of curves having a substantially constant respective initial positive sequence voltage phasor.

7. The method of claim 5, wherein the step of determining the function further includes creating a plurality of curves of the current ratio with respect to the magnitude of the initial positive sequence voltage phasor, each of the plurality of curves having a substantially constant respective initial positive sequence current phasor.

8. The method of claim 5, wherein the step of determining the function further includes defining a plurality of bins with each bin representing a range of magnitudes of the initial positive sequence voltage phasor and a range of magnitudes of the initial positive sequence current phasor, and estimating a mean and a standard deviation of the current ratio for each of the plurality of bins.

9. The method of claim 5, wherein the step of determining the function further includes forming a surface curve of the current ratio with respect to both the magnitude of the initial positive sequence current phasor and the magnitude of the initial positive sequence voltage phasor.

10. An apparatus for detecting turn faults in an induction motor, the apparatus comprising:

at least two current sensors for obtaining at least two motor current waveforms;

at least two voltage sensors for obtaining at least two motor voltage waveforms;

an analog to digital converter for converting the motor current waveforms to digitized current waveforms and the motor voltage waveforms to digitized voltage waveforms;

a transformer for extracting fundamental phasors of the digitized current waveforms and the digitized voltage waveforms and applying a symmetrical component transform to the fundamental phasors to obtain symmetrical component current and voltage phasors including a negative sequence voltage phasor ($V_-$) and negative sequence current phasor ($I_-$);

a processor for estimating a residual injected negative sequence current (Ir), estimating a fault injected negative sequence current ($Ii_-$) according to the following equation:

$$Ii_- = I_- - V_-/Z_- - Ir,$$

wherein $Z_-$ comprises a characteristic negative sequence impedance, and determining the existence of a turn fault by comparing the estimated fault injected negative sequence current with a threshold fault injected negative sequence current.

11. The apparatus of claim 10, further including means for determining a function for the residual injected negative sequence current.

12. The apparatus of claim 10, wherein the transformer for extracting fundamental phasors of the digitized current waveforms and the digitized voltage waveforms and applying a symmetrical component transform to the fundamental phasors to obtain symmetrical component current and voltage phasors is adapted to obtain a positive sequence voltage phasor and a positive sequence current phasor; and further including means for determining a function for the residual injected negative sequence current dependent upon the positive sequence voltage phasor and the positive sequence current phasor.

13. The apparatus of claim 12, wherein the means for determining a function for the residual injected negative sequence current dependent upon the positive sequence voltage phasor and the positive sequence current phasor include:

the at least two current sensors for obtaining at least two initial motor current waveforms;

the at least two voltage sensors for obtaining at least two initial motor voltage waveforms;

the analog to digital converter for converting the initial motor current waveforms to initial digitized current waveforms and the initial motor voltage waveforms to initial digitized voltage waveforms;

the transformer for extracting fundamental phasors of the initial digitized current waveforms and the initial digitized voltage waveforms and applying a symmetrical component transform to the fundamental phasors to obtain initial symmetrical component current and voltage phasors including initial positive sequence voltage phasors, initial positive sequence current phasors, and initial negative sequence current phasors; and means for estimating a current ratio of each one of the negative sequence current phasors to a respective one of the positive sequence current phasors.

14. The apparatus of claim 13, wherein the means for determining a function for the residual injected negative sequence current dependent upon the positive sequence voltage phasor and the positive sequence current phasor further include means for creating a plurality of curves of the current ratio with respect to the magnitude of the initial positive sequence current phasor, each of the plurality of curves having a substantially constant respective initial positive sequence voltage phasor.

15. The apparatus of claim 13, wherein the means for determining a function for the residual injected negative sequence current dependent upon the positive sequence voltage phasor and the positive sequence current phasor further include means for creating a plurality of curves of the current ratio with respect to the magnitude of the initial positive sequence voltage phasor, each of the plurality of curves having a substantially constant respective initial positive sequence current phasor.

16. The apparatus of claim 13, wherein the means for determining a function for the residual injected negative sequence current dependent upon the positive sequence voltage phasor and the positive sequence current phasor further include means for defining a plurality of bins with each bin representing a range of magnitudes of the initial positive sequence voltage phasor and a range of magnitudes of the initial positive sequence current phasor, and estimating a mean and a standard deviation of the current ratio for each of the plurality of bins.

17. The apparatus of claim 13, wherein the means for determining a function for the residual injected negative sequence current dependent upon the positive sequence voltage phasor and the positive sequence current phasor further include means for forming a surface curve of the current ratio with respect to both the magnitude of the initial positive sequence current phasor and the magnitude of the initial positive sequence voltage phasor.

* * * * *